United States Patent
Tsai et al.

(10) Patent No.: US 12,316,104 B2
(45) Date of Patent: May 27, 2025

(54) SURGE PROTECTION MODULE

(71) Applicants: Shen-Hao Tsai, Taoyuan (TW);
Chin-Yuan Chang, Taoyuan (TW);
Chun-Hao Hu, Taoyuan (TW); Yu-Jui Liu, Taoyuan (TW)

(72) Inventors: Shen-Hao Tsai, Taoyuan (TW);
Chin-Yuan Chang, Taoyuan (TW);
Chun-Hao Hu, Taoyuan (TW); Yu-Jui Liu, Taoyuan (TW)

(73) Assignee: Chroma ATE Inc., Taoyuan (TW)

( * ) Notice: Subject to any disclaimer, the term of this patent is extended or adjusted under 35 U.S.C. 154(b) by 0 days.

(21) Appl. No.: 17/565,509

(22) Filed: Dec. 30, 2021

(65) Prior Publication Data

US 2022/0209529 A1 Jun. 30, 2022

(30) Foreign Application Priority Data

Dec. 31, 2020 (TW) ................................ 109146993

(51) Int. Cl.
*H02H 9/04* (2006.01)
(52) U.S. Cl.
CPC ............ *H02H 9/041* (2013.01); *H02H 9/044* (2013.01)
(58) Field of Classification Search
CPC .......... H02H 9/04; H02H 9/041; H02H 9/044; H02H 9/043; G01R 1/073; G01R 1/067; G01R 1/07328; H05F 1/00

USPC ........................................... 361/56, 212, 220
See application file for complete search history.

(56) References Cited

U.S. PATENT DOCUMENTS

| 5,663,655 A * | 9/1997 | Johnston ................... G01R 1/18 |
| | | 324/756.07 |
| 7,522,401 B2 * | 4/2009 | Dela Cruz ........... H05K 9/0067 |
| | | 361/220 |
| 8,975,909 B1 * | 3/2015 | Cortez .................. G01R 1/0466 |
| | | 324/754.01 |
| 11,043,484 B1 * | 6/2021 | Shi ...................... G01R 31/2863 |
| 2014/0167799 A1 * | 6/2014 | Wang ........................ H05F 3/02 |
| | | 361/220 |

* cited by examiner

*Primary Examiner* — Danny Nguyen (57) ABSTRACT

The present invention provides a surge protection module which comprises a carrier board and a probe set. The carrier board is used to carry an electronic component. The probe set is disposed on the carrier board and has a plurality of probes and a short-circuit unit. Each probe is used for contacting the electronic component, and the short-circuit unit is selectively moved to a first position or a second position. When the short-circuit unit is moved to the first position, the short-circuit unit simultaneously contacts and shorts the plurality of probes. When the short-circuit unit is moved to the second position, the short-circuit unit is away from at least one of the plurality of probes.

6 Claims, 8 Drawing Sheets

SURGE PROTECTION MODULE

CROSS REFERENCE TO RELATED APPLICATION

The present application claims priority to Taiwan patent application Serial No. 109146993 filed on Dec. 31, 2020, the entire content of which is incorporated by reference to this application.

BACKGROUND OF THE INVENTION

1. Field of the Invention

The present invention pertains to a surge protection module, more specifically to a module using mechanism design to realize surge protection function.

2. Description of the Prior Art

Generally speaking, since the manufactured product has a relatively complete protection mechanism for the electrostatic discharge, electronic components in the product are less susceptible to be damaged by the electrostatic discharge. However, the electronic components can barely withstand the attack of the electrostatic discharge before being installed in the product. For example, when installing an electronic component or contacting the electronic component with probes, the electronic component can easily be attacked by the electrostatic discharge because they are yet to be connected to the protection mechanism of the product. In order to prevent the electronic component from being attacked by electrostatic discharge before they are installed properly, the electronic component may be installed in the surge protection module in the first place. The traditional surge protection module has many active components and circuits to protect the electronic component from the electrostatic discharge, and reduce the damage to the electronic component.

However, it can be known from some experimental data that when the electronic component is operated in specific operating environments, such as high temperature, high pressure, and low operating current, the active components and circuits of the traditional surge protection module may significantly decrease their electrostatic protection efficiency. Accordingly, the industry needs a new surge protection module that uses mechanical components to reduce the probability of the electronic component being attacked by the electrostatic discharge, so as to solve the problem of being unable to use active components when the electronic component is operated in high temperature, high pressure, and low operating current.

SUMMARY OF THE INVENTION

The present invention provides a surge protection module in which a plurality of probes in the surge protection module will be short-circuited together by default, and the probes will be short-circuited until they are correctly installed in the test device, so as to reduce the possibility of the electronic component being damaged by electrostatic discharge.

The present invention provides a surge protection module which comprises a carrier board and a probe set. The carrier board is used to carry an electronic component. The probe set is disposed on the carrier board and has a plurality of probes and a short-circuit unit. Each probe is used for contacting the electronic component, and the short-circuit unit is selectively moved to a first position or a second position. When the short-circuit unit is moved to the first position, the short-circuit unit simultaneously contacts and shorts the plurality of probes. When the short-circuit unit is moved to the second position, the short-circuit unit is away from at least one of the plurality of probes.

In some embodiments, the short-circuit unit may be at the first position by default. Each of the probes may have a feeding part, an extension part and a contact part, the extension part is connected between the feeding part and the contact part, the feeding part is used for connecting a test device, and the contact part is used for contacting the electronic component. The short-circuit unit may be disposed on the extension part of one of the probes, when the short-circuit unit is at the first position, the short-circuit unit may contact the extension part of each probe simultaneously. When the carrier board is set in a test area of the test device, the short-circuit unit at the first position may be pushed by a positioning member of the test device to the second position. Besides, the surge protection module may further has an elastic element, the elastic element is preset to press the short-circuit unit to the first position. When the short-circuit unit is at the first position, the short-circuit unit may further contact the feeding part of each probe simultaneously. The feeding part has a top surface, the elastic element may be preset to press the short-circuit unit to the top surface.

In summary, the surge protection module provided by the present invention has the short-circuit unit realized by mechanical means. The short-circuit unit can contact multiple probes at the same time, so that the multiple probes are short-circuited together by default. Moreover, the short-circuit unit will not be moved and keep the probes short-circuited until the surge protection module is correctly installed in the test device. Thereby, the surge protection module provided by the present invention can reduce the possibility of the electronic component being damaged by the electrostatic discharge.

DETAILED DESCRIPTION OF THE INVENTION

The features, objections, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
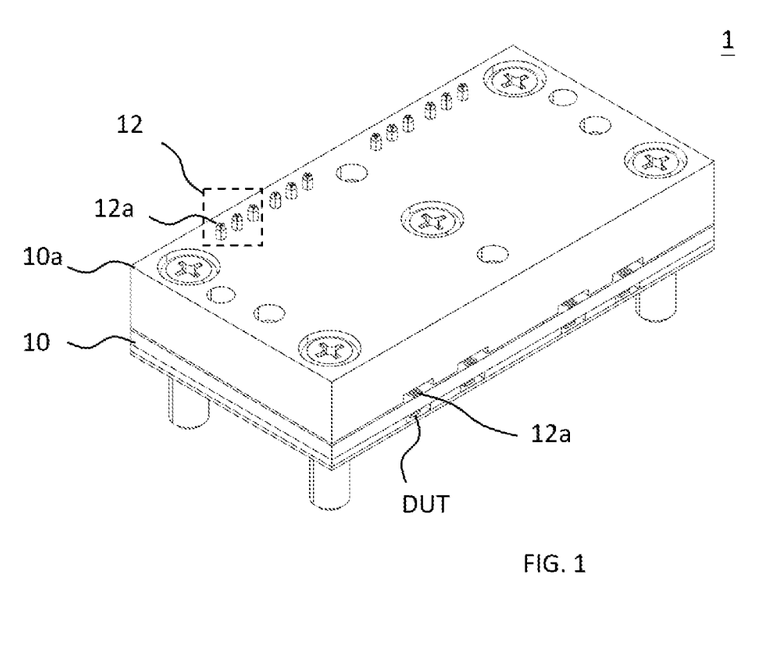
FIG. 1 is a schematic diagram of a surge protection module in accordance with an embodiment of the present invention.
Figure 2:
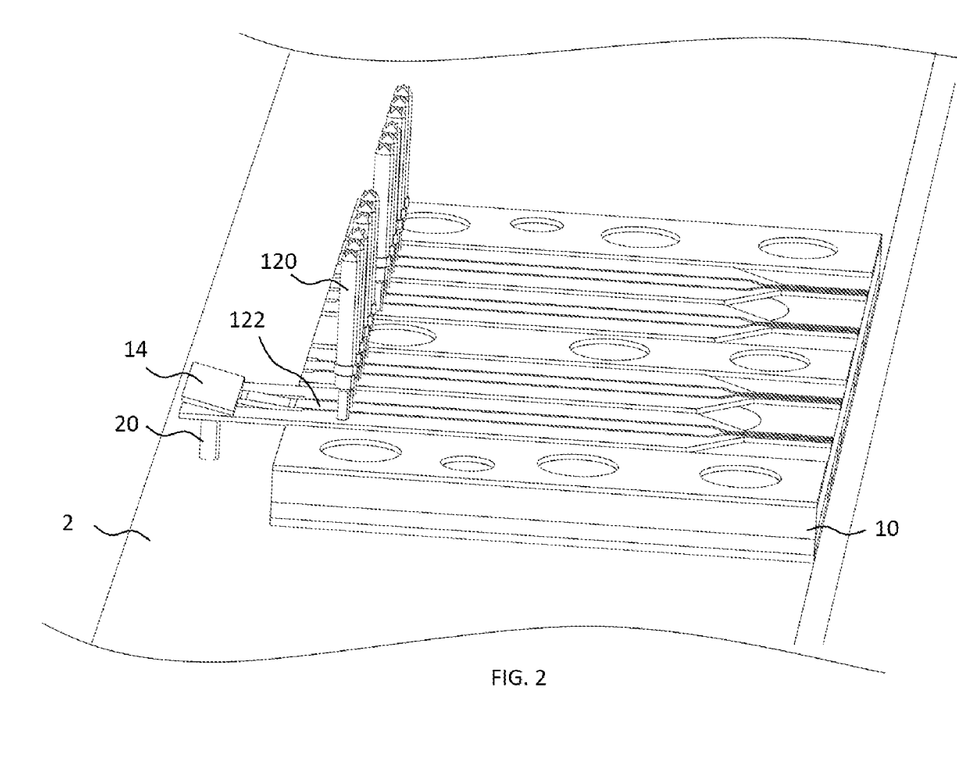
FIG. 2 is a schematic diagram of the surge protection module removing the top cover in accordance with an embodiment of the present invention.
Figure 3:
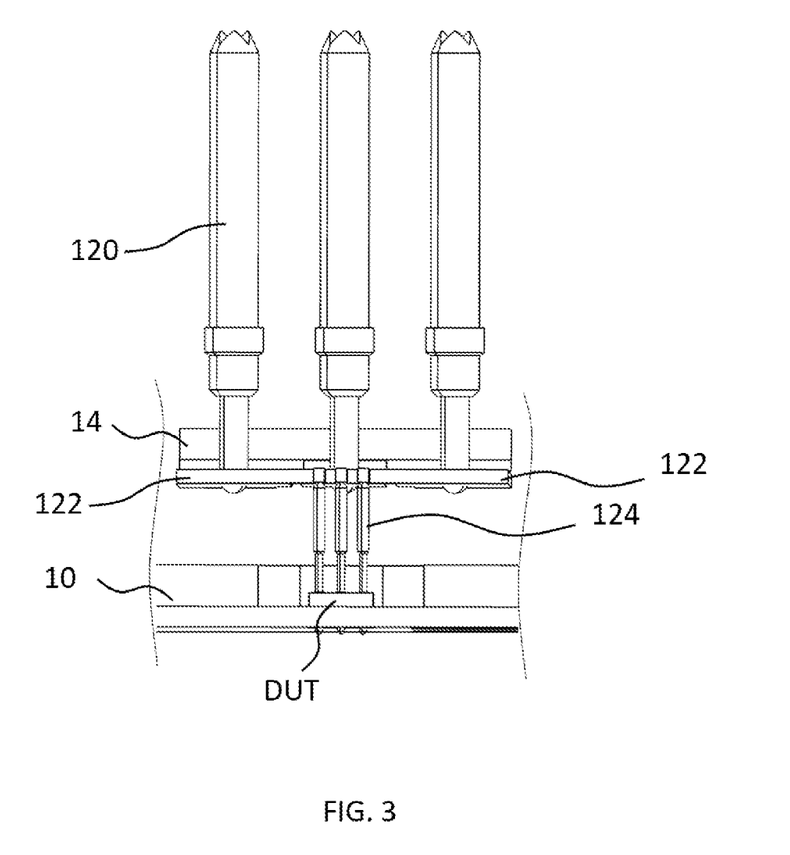
FIG. 3 is a schematic diagram of the probe set in accordance with an embodiment of the present invention.

Please refer to FIG. 1, FIG. 2 and FIG. 3 together. FIG. 1 is a schematic diagram of a surge protection module in accordance with an embodiment of the present invention, FIG. 2 is a schematic diagram of the surge protection module removing a top cover in accordance with an embodiment of the present invention, and FIG. 3 is a schematic diagram of the probe set in accordance with an embodiment of the present invention. As shown in the figures, the surge protection module 1 has a carrier board 10 and a probe set 12. Since the carrier board 10 is also covered with a top cover 10a, the detail of the probe set 12 is not shown in FIG. 1. The carrier board 10 can be used to carry the electronic component DUT which can be, but not limited to, a laser diode. For example, the electronic component DUT may also be a chip with other functions or an optoelectronic component. Besides, the probe set 12 has a plurality of probes 12a, and the probes 12a may be arranged on the carrier board 10 and covered by the top cover 10a. In one example, the carrier board 10 may have a ground terminal, and the ground terminal may be electrically connected to a metal plate. Person having ordinary skill in the art should understand that the metal plate can be regarded as a system ground (GND). In other words, when the electronic component DUT is disposed on the carrier board 10, there may be no potential difference between the carrier board 10 and the electronic component DUT, and the carrier board 10 and the electronic component DUT may both have a ground potential.

One end of each probe 12a in the probe set 12 can contact the electronic component DUT, and the other end of each probe 12a will pass through the top cover 10a, so that the test device can be connected to the exposed end of each probe 12a. In practice, the carrier board 10 and the top cover 10a can form a box, and most of the probes 12a can be covered by the top cover 10a, or only a part of the probes 12a will be exposed to the top cover 10a. Since the box can block external interference as much as possible, the probe 12a can have a higher accuracy while measuring the electrical parameters of the electronic component DUT in the box. Although there are three probes 12a in the probe set 12 illustrated in FIG. 1, the number of probes 12a is not limited in this embodiment. In one example, the number of probes 12a is related to the number of pins of the electronic component DUT.

In addition, the top cover 10a can be locked on the carrier board 10 by screws, and one function of the top cover 10a is to protect the internal components of the surge protection module 1 and the electronic components DUT, such as a plurality of probes 12a which can be fixed between the top cover 10a and the carrier board 10. In practice, the surge protection module 1 can be fastened to the test device 2 by screws connected with the carrier board 10. Although FIG. 1 shows many probes 12a, these probes 12a may belong to different probe sets 12 respectively. Each probe set 12 corresponds to one electronic component DUT, and the surge protection module 1 of FIG. 1 may be provided with four electronic component DUTs, that is, there may be four probe sets 12 in the surge protection module 1. In other words, it can be seen that in the example shown in FIG. 1, the total number of probes 12a passing through the top cover 10a is twelve. However, in order to avoid confusion, only the leftmost probe set 12 is used for description in this embodiment.

Next, in order to make it easier to see the internal components of the surge protection module 1, FIG. 2 removes the top cover 10a and some screws in FIG. 1. The internal components in the surge protection module 1 may have many probes 12a, each of the probes 12a has a feeding part 120, an extension part 122 and a contact part 124. This embodiment does not limit whether the materials of the feeding part 120, the extension part 122 and the contact part 124 are the same, but the feeding part 120, the extension part 122 and the contact part 124 should all be made of conductive materials. In the example shown in FIG. 2 and FIG. 3, the extension part 122 of each probe 12a may be disposed on the carrier board 10, the feeding part 120 may be vertically connected to the extension part 122, and the contact part 124 may be vertically connected between the extension part 122 and the electronic component DUT. In addition, the feeding part 120 and the contact part 124 may be respectively disposed at two ends of the extension part 122 and connected to different sides/surfaces of the extension part 122. For example, in FIG. 2, the feeding part 120 may be arranged on the upper side of the left end of the extension part 122, and the contact part 124 may be arranged on the lower side of the right end of the extension part 122. It is not easy to see the position of the contact part 124 in FIG. 2 due to the view point. Since FIG. 3 is viewed from the right side of FIG. 2, and the relative position between the feeding part 120 and the contact part 124 can be clearly seen from FIG. 3. In an example, all of the extension parts 122 may be cut from a metal plate, but the adjacent extension parts 122 are not connected to each other.

Moreover, the surge protection module 1 of FIG. 2 is installed on the test device 2. The test device 2 can be electrically connected to the electronic component DUT through the probe set 12 in the surge protection module 1, so the test device 2 can measure various electrical parameters such as voltage, current, or impedance of the electronic component DUT. In order to enable the probes 12a of the probe set 12 to be aligned with the terminals of the test device 2, the test device 2 may have a test area. In practice, as long as the surge protection module 1 is correctly installed in the test area, it should be able to ensure that the probe 12a can be aligned with the terminal of the test device 2. In the example shown in FIG. 2, it can be seen that one of the probe sets 12 of the surge protection module 1 has a short-circuit unit 14, and the test device 2 has a positioning member 20. For example, the short-circuit unit 14 can be connected to the middle probe 12a and should be flexible. Of course, the present embodiment does not limit the location of the short-circuit unit 14 is mounted. For example, the short-circuit unit 14 may also be connected to probes 12a in other positions of the same probe set 12. The positioning member 20 may be a column, and the positioning member 20 should be tall enough to push the short-circuit unit 14. When the surge protection module 1 is correctly installed in the test area, the short-circuit unit 14 and the positioning member 20 will contact, so that the short-circuit unit 14 is pushed upward by the positioning member 20.

Figure 4:
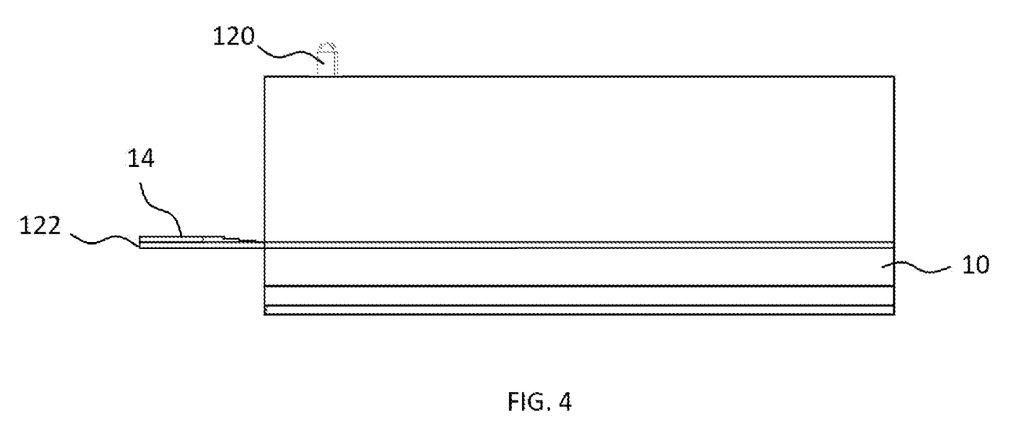
FIG. 4 is a side view of the short-circuit unit of the surge protection module at the first position in accordance with an embodiment of the present invention.
Figure 5:
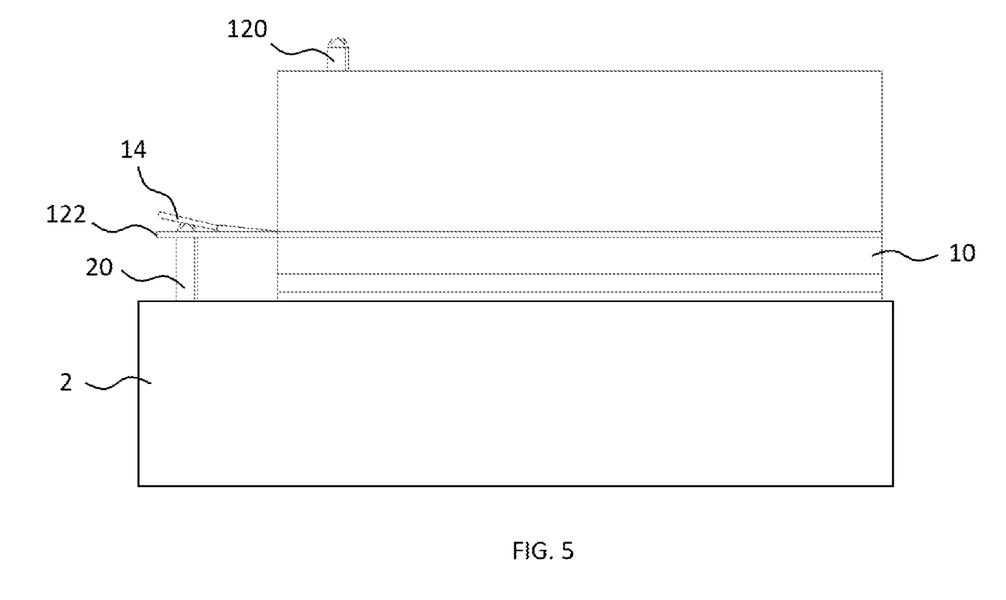
FIG. 5 is a side view of the short-circuit unit of the surge protection module at the second position in accordance with an embodiment of the present invention.
Figure 6:
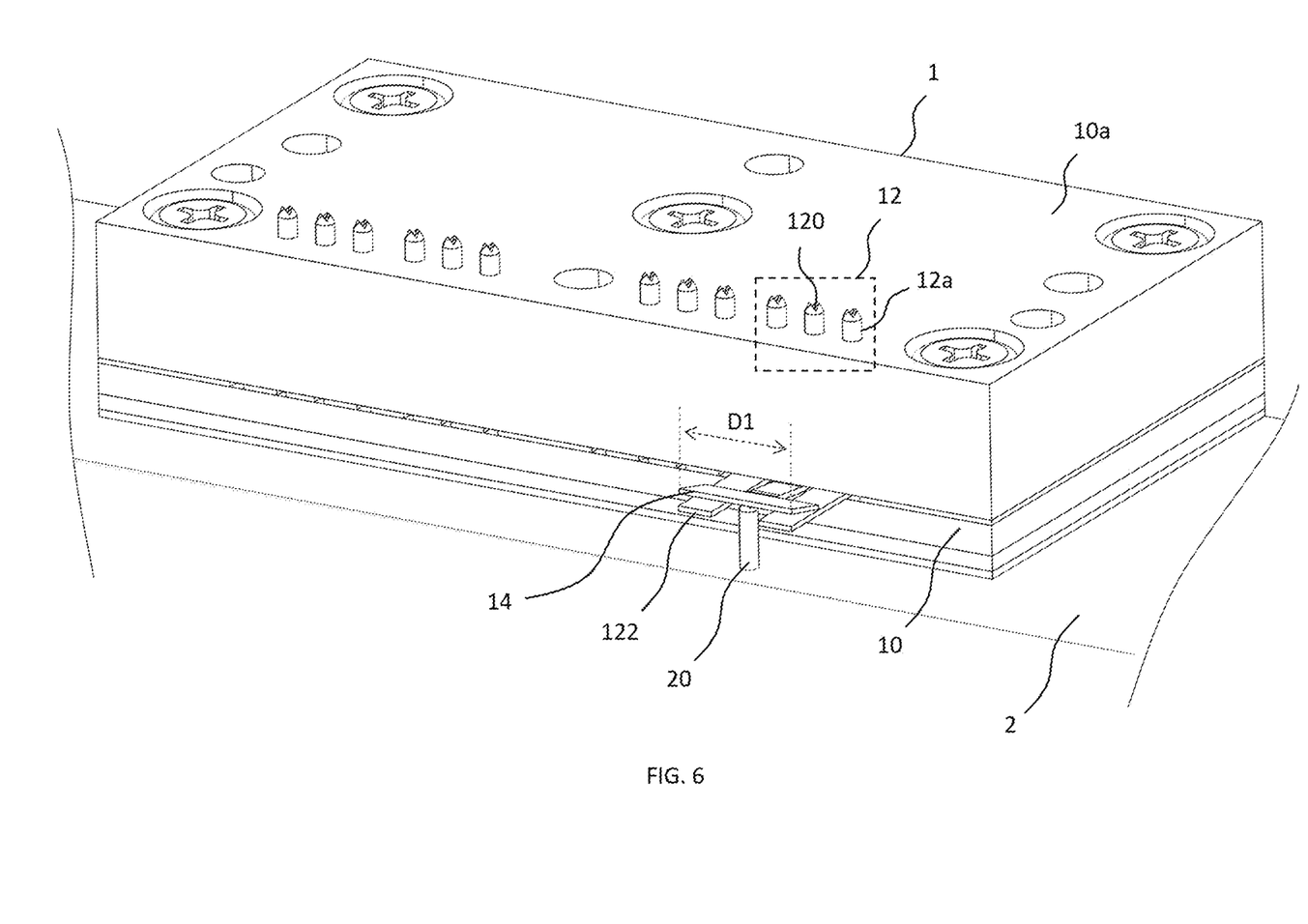
FIG. 6 is a schematic diagram of the surge protection module disposed in the test device in accordance with an embodiment of the present invention.

In order to explain how the short-circuit unit 14 and the positioning member 20 work together, please refer to FIG. 4, FIG. 5 and FIG. 6 together. FIG. 4 is a side view of the short-circuit unit of the surge protection module at the first position in accordance with an embodiment of the present invention. FIG. 5 is a side view of the short-circuit unit of the surge protection module at the second position in accordance with an embodiment of the present invention. FIG. 6 is a schematic diagram of the surge protection module disposed in the test device in accordance with an embodiment of the present invention. As shown in FIG. 4, when the surge protection module 1 has not been installed in the test device 2, especially when the surge protection module 1 has not been installed correctly in the test area, the short-circuit unit 14 will flatly contact all the probes 12a in the same probe set 12. For example, the short-circuit unit 14 contacts the extension parts 122 of all the probes 12a at the same time. At this time, because the short-circuit unit 14 contacts all the extension parts 122 at the same time, all the probes 12a in the same probe set 12 will be short-circuited with each other. When the short-circuit unit 14 can contact more than two transition parts 122, the short-circuit unit 14 is said to be in the first position in this embodiment. In one example, the short-circuit unit 14 is preset at the first position, so that when the surge protection module 1 is transported or during installation, the surge current caused by the electrostatic discharge will be guided to other places by the short-circuited probe 12a, and the surge current will not attack the electronic component DUT along the probe 12a.

Person having ordinary skill in the art can understand that when the surge protection module 1 has not been placed in an appropriate position (such as the test area) in the test device 2, it may generate the surge current caused by the electrostatic discharge not only during transporting or contacting between equipment, but also when the moment the probe 12a just touches the electronic component DUT. Accordingly, this embodiment demonstrates that the short-circuit unit 14 will always be maintained at the first position by default. In practice, before the probe 12a is in contact with the electronic component DUT, the plurality of probes 12a can be short-circuited by the short-circuit unit 14, and the plurality of probes 12a may be electrically connected to the ground potential first. In other words, if the surge current caused by the electrostatic discharge is generated when the probes 12a contact the electronic component DUT, the surge current can be guided to the ground from the probe 12a directly and the surge current can bypass the electronic component DUT.

On the other hand, after the surge protection module 1 is installed in the test device 2, the surge protection module 1, in FIG. 5 for example, is vertically placed down to the corresponding test area of the test device 2. The positioning member 20 provided in the corresponding test area of the test device 2 will naturally be aligned with the short-circuit unit 14, so that the positioning member 20, without moving or lifting, can easily push the short-circuit unit 14 away from the first position. In other words, the positioning member 20 does not need complicated mechanism, and only needs to be placed in a preset position that can be aligned with the short-circuit unit 14. After the short-circuit unit 14 is pushed away from the first position, the short-circuit unit 14 no longer contact the extension parts 122 of all the probes 12a. It is worth mentioning that it does not mean that the electronic component DUT no longer needs electrostatic protection, but because the surge protection module 1 has been correctly placed in the corresponding test area of the test device 2, the test device 2 can provide its electrostatic protection then. Of course, because the test device 2 usually can shield static electricity or magnetic field, it also means that the probability of the electronic component DUT being suddenly attacked by the surge current is reduced. However, since it is difficult to determine when or where the surge current is generated, the test device 2 can do some inspections, such as checking whether the surge protection module 1 is actually installed. Only when the surge protection module 1 is correctly installed, the positioning member 20 in the test device 2 can push the short-circuit unit 14 away from the first position, that is, cuts off the short circuit between the probes 12a, and allows the probes 12 to test the electronic component DUT separately.

In one example, since the short-circuit unit 14 is connected to the middle probe 12a in the probe set 12, the short-circuit unit 14 will be inclined or tilted after being pushed away from the first position by the positioning member 20. As shown in the examples shown in FIG. 5 and FIG. 6, although the short-circuit unit 14 is still connected to one of the extension parts 122, it has not touched the other two extension parts 122. It can be said that the short-circuit unit 14 no longer contacts all the extension parts 122 at the same time. In other words, the three probes 12a in the same probe set 12 are no longer short-circuited. When the short-circuit unit 14 leaves the first position so as not to contact more than two extension parts 122 at the same time, the short-circuit unit 14 is said to be in the second position in this embodiment. In an example, after the surge protection module 1 is removed from the test area of the test device 2, for example, after the test of the electronic component DUT is completed, the short-circuit unit 14 is separated from the positioning member 20. At this time, the short-circuit unit 14 can be automatically back to the first position. In one example, the extension part 122 connected the short-circuit unit 14 may be elasticity, so that the short-circuit unit 14 can be pressed against all the extension parts 122 again. Thereby, the short-circuit unit 14 can short-circuit all the probes 12a, so that the surge protection module 1 can still maintain the effect of electrostatic protection after the test.

This embodiment does not limit the structure or size of the short-circuit unit 14. The short-circuit unit 14 in this embodiment may be a rectangular plate with a width D1. In an example, the width D1 may be exactly the sum of the widths of all the extension parts 122 in the same probe set 12, as shown in FIG. 6. Person having ordinary skill in the art can understand that as long as the width D1 of the short-circuit unit 14 can be greater than the width of one extension part 122, the short-circuit unit 14 might be able to cover the other extension parts 122 at the first position, and the short-circuit unit 14 can short-circuit the extension parts 122. In practice, the width D1 of the short-circuit unit 14 can be greater than or equal to the sum of the widths of all the extension parts 122 in the same probe set 12. Increasing the area of the short-circuit unit 14 contacting other extension parts 122 can lower the impedance and be more stable.

Figure 7:
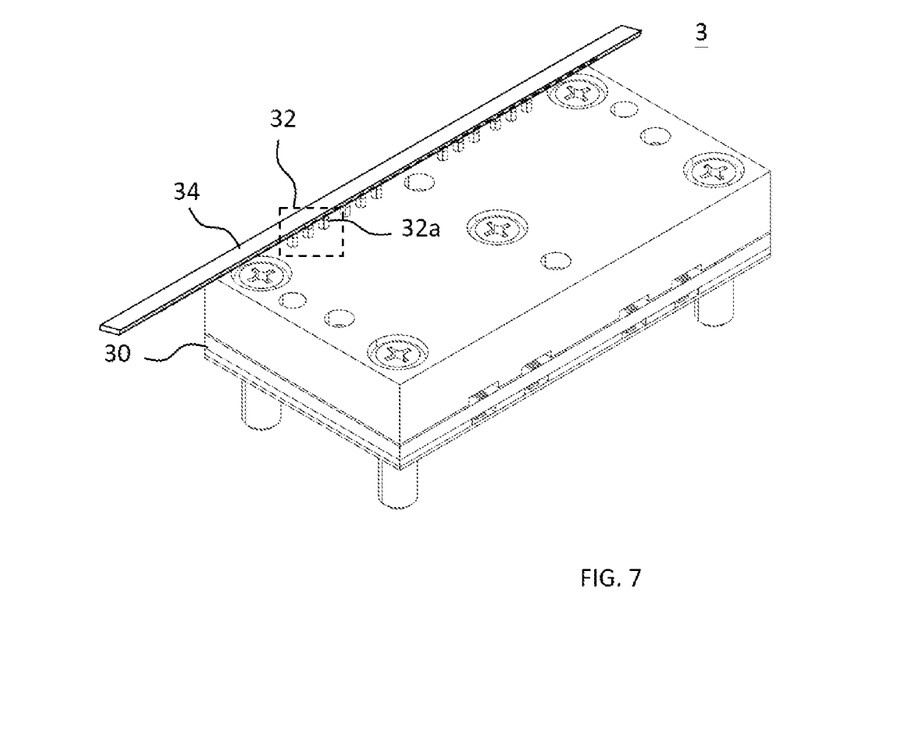
FIG. 7 is a schematic diagram of the short-circuit unit of the surge protection module at the first position in accordance with another embodiment of the present invention.
Figure 8:
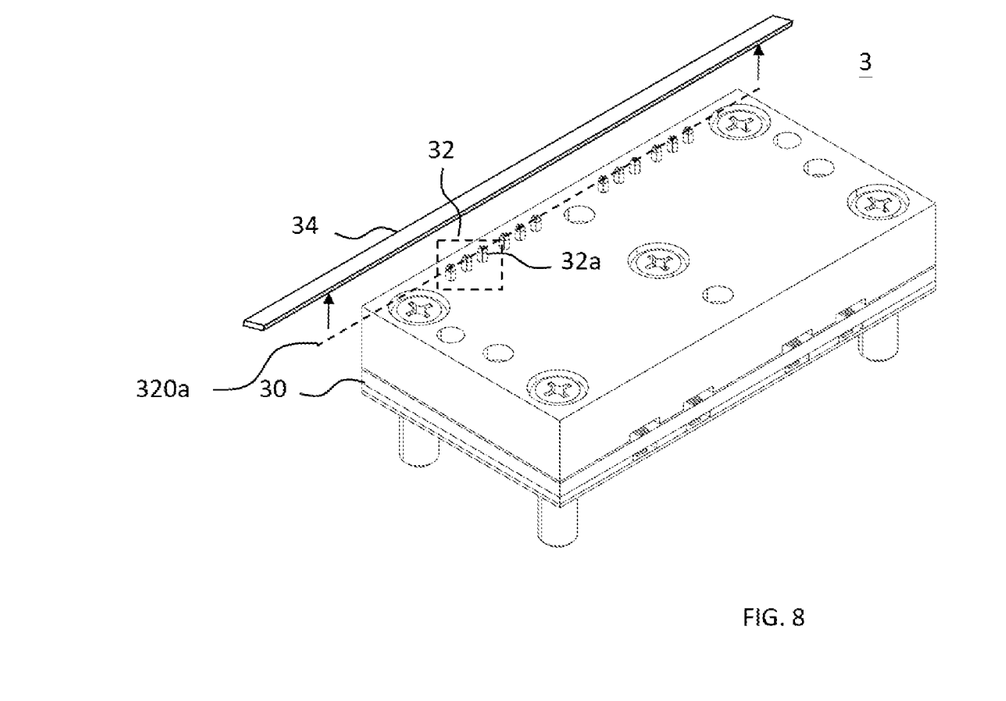
FIG. 8 is a schematic diagram of the short-circuit unit of the surge protection module at the second position in accordance with another embodiment of the present invention.

This embodiment does not limit the short-circuit unit 14 to only contact the extension part 122. Please refer to FIG. 6, FIG. 7 and FIG. 8 together. FIG. 7 is a schematic diagram of the short-circuit unit of the surge protection module at the first position in accordance with another embodiment of the present invention, and FIG. 8 is a schematic diagram of the short-circuit unit of the surge protection module at the second position in accordance with another embodiment of the present invention. The same as the previous embodiment, the surge protection module 3 has a carrier board 30 and a probe set 32, and the carrier board 30 is also covered with a top cover 30a. The structure of the carrier board 30, the top cover 30a, and the probe set 32 can be roughly the same as the previous embodiment. For example, the probe set 32 may also have a plurality of probes 32a, and each probe 32a may have a feeding part, an extension part, and a contact part, which will not be repeated in this embodiment. A slight difference from the previous embodiment is that the short-circuit unit 34 is no longer connected to the extension part of the probe, but is arranged outside the top cover 30a. For example, the short-circuit unit 34 may be a conductive bar with elastic elements (not shown), so that the short-circuit unit 34 can move vertically.

When the surge protection module 3 has not been installed in the aforementioned test device, especially has not been correctly installed in the test area, the short-circuit unit 34 will contact all the feeding parts of the probe set 32. For example, the short-circuit unit 34 will contact the top surface of each the feeding part. The top surfaces of all the feeding parts may form a co-plane surface 320a, and the short-circuit unit 34 may be preset to contact the co-plane surface 320a (first position). At this time, because the short-circuit unit 34 contacts all the feeding parts at the same time, all the probes 32a will be short-circuited with each other. In one example, the elastic element may be a spring, and both ends of the spring may be connected to the short-circuit unit 34 and the carrier board 30 respectively, so that the short-circuit unit 34 can be pressed against the carrier board 30 by the restoring force of the spring. Since the short-circuit unit 34 is preset to be pressed at the first position by the elastic element, when the surge protection module 3 is being transported or installed, the surge current of electrostatic discharge will be guided to other places by the short-circuited probe 32a, and will not attack the electronic component DUT along the probe 32a.

On the other hand, when the surge protection module 3 is installed in the test device, the positioning member (not shown in FIG. 7 and FIG. 8) arranged in the corresponding test area of the test device will be aligned with the short-circuit unit 34. For example, the positioning member can be arranged at both ends of the short-circuit unit 34. Therefore, the positioning member will naturally without moving or lifting, push the short-circuit unit 34 away from the first position when the surge protection module 3 is placed on the test device vertically. When the short-circuit unit 34 is pushed away from the first position, the short-circuit unit 34 will no longer contact the feeding parts of all the probes 32a at the same time, that is, the short-circuit unit 34 will leave the co-planar surface 320a, and the probes 32a are no longer short-circuited together. The isolated probes 32a can perform the function of testing the electronic component DUT, and the test device can continue to provide the electrostatic protection.

In summary, the surge protection module provided by the present invention has the short-circuit unit realized by mechanical means. The short-circuit unit can contact multiple probes at the same time, so that the multiple probes are short-circuited together by default. Moreover, the short-circuit unit will not be moved and keep the probes short-circuited until the surge protection module is correctly installed in the test device. Different from the use of active components for electrostatic protection, the surge protection module provided by the present invention uses mechanical means for electrostatic protection, so that it can deal with specific working environments cannot be protected by active components, such as high temperature, high pressure, and low operating current.

What is claimed is:

1. A surge protection module, comprising:
   a carrier board for carrying an electronic component;
   a probe set, disposed on the carrier board, having a plurality of probes and a short-circuit unit; and
   an elastic element, wherein the elastic element is preset to press the short-circuit unit to a first position;
   wherein each probe is used for contacting the electronic component, and the short-circuit unit is selectively moved to the first position or a second position;
   wherein when the short-circuit unit is moved to the first position, the short-circuit unit simultaneously contacts and shorts the plurality of probes;
   wherein when the short-circuit unit is moved to the second position, the short-circuit unit is away from at least one of the plurality of probes;
   wherein the short-circuit unit is at the first position by default.

2. The surge protection module according to claim 1, wherein each of the probes comprises a feeding part, an extension part and a contact part, the extension part is connected between the feeding part and the contact part, the feeding part is used for connecting a test device, and the contact part is used for contacting the electronic component.

3. The surge protection module according to claim 2, wherein the short-circuit unit is disposed on the extension part of one of the probes, when the short-circuit unit is at the first position, the short-circuit unit contacts the extension part of each probe simultaneously.

4. The surge protection module according to claim 2, wherein when the carrier board is set in a test area of the test device, the short-circuit unit at the first position is pushed by a positioning member of the test device to the second position.

5. The surge protection module according to claim 1, wherein when the short-circuit unit is at the first position, the short-circuit unit contacts the feeding part of each probe simultaneously.

6. The surge protection module according to claim 5, wherein the feeding part has a top surface, the elastic element is preset to press the short-circuit unit to the top surface.

* * * * *